United States Patent [19]
Whitney et al.

[11] Patent Number: 6,117,178
[45] Date of Patent: Sep. 12, 2000

[54] EXPLOSION CONSEQUENCES AND SITING ANALYSIS TOOL

[75] Inventors: Mark G. Whitney, Bulverde; Michael W. Stahl, Adkins, both of Tex.

[73] Assignee: Wilfred Baker Engineering, Inc., San Antonio, Tex.

[21] Appl. No.: 08/998,808

[22] Filed: Dec. 29, 1997

Related U.S. Application Data

[60] Provisional application No. 60/034,157, Dec. 30, 1996.
[51] Int. Cl.$^7$ .................... G06G 7/48; G06G 7/58
[52] U.S. Cl. ................ 703/12; 703/2; 703/5; 703/7; 73/35.14; 102/355
[58] Field of Search ............ 395/500; 364/578; 73/35.14; 703/2, 5, 7, 11, 12; 102/355

[56] References Cited

PUBLICATIONS

Whitney et al, "'Safesite' Software for Siting Evalutions", Energetic Events, vol. 3, No. 3, pp. 1–3, Aug. 1995.
Bjerketvedt et al, "Gas Explosion Handbook", http://www.cmr.no/english/gexcon/Handbook/GEXHBcontents.htm, 1997.
"Process Safety Management", Professional Safety (American Society of Safety Engineers), pp. 16–22, Aug. 1993.

Primary Examiner—Kevin J. Teska
Assistant Examiner—Samuel Broda
Attorney, Agent, or Firm—McDermott, Will & Emery

[57] ABSTRACT

A computer system whereby the user selects any combination of hazards and buildings which are of interest in modeling and simulating potential explosions. The software of the present invention automatically calculates distance and orientation of various building surfaces from the hazard, and accounts for side-on and reflected loads based on the orientation. The user is then provided with the pressure-impulse diagrams (P-i diagrams) where the software determines the damage expected for each building component. The results are displayed in a table which gives the applied blast load and damage level for each component on each building surface.

14 Claims, 21 Drawing Sheets

SCENARIO DEFINITION

SCENARIO NAME: CCO27-90I

SCENARIO DESCRIPTION: SHAFT FAILURE FROM PROPYLENE PUMP JA-1733 1.5" LIQ

AMBIENT AIR PRESSURE: 14.7 PSIA

AMBIENT AIR TEMPERATURE: 70 DEG. F

SPEED OF SOUND: 13541.47 IN/SEC

USER DEFINED ISOBAR [PSIG]
- VALUE 1: 1
- VALUE 2: 0.5
- VALUE 3: 0.3
- VALUE 4: 0.2
- VALUE 5: 0.1

BAKER-STREHLOW METHOD - POTENTIAL EXPLOSION SITES (PES):

| NAME | DESCRIPTION | SOURCE ENERGY | FLAME SPEED | CONNECTIVITY GROUP |
|------|-------------|---------------|-------------|--------------------|
| 34 | | 1.17E+09 | 0.037 | a |
| 35 | | 1.7E+10 | 0.662 | a |
| 36 | | 1.16E+10 | 0.037 | a |
| 37 | | 4.9E+09 | 0.1 | a |
| 65 | | 5.6E+09 | 0.206 | a |
| 66 | | 1.4E+10 | 0.037 | a |
| 67 | | 3.8E+09 | 0.037 | a |
| 91 | | 2.25E+09 | 0.037 | a |
| 94 | | 1.9E+10 | 0.037 | a |
| 96 | | 2.2E+09 | 0.037 | a |

[DUPLICATE PES] [ADD PES] [DELETE PES] [HELP] [CANCEL] [OK]

FIG. 8

| SAFESITE - C:/SAFESITE/PLANTS/OXYCC458.MDB - [SCENARIO SUMMARY] | | | | |
|---|---|---|---|---|
| FILE PLANT SETUP RUN ANALYSIS ANALYSIS RESULTS PREFERENCES WINDOW HELP | | | | |

SCENARIOS:

| NAME | DESCRIPTION | AIR PRESSURE | AIR TEMPERATURE | SPEED SOUND |
|---|---|---|---|---|
| 28 CLOSE IN VCE 1" PROPYLENE RELEASE | | 14.7 | 70 | 13541.47 |
| 4NEW-160 | | 14.7 | 70 | 13541.47 |
| CC13 - NEW | | 14.7 | 70 | 13541.47 |
| CC4NEW - 135 | | 14.7 | 70 | 13541.47 |
| CC7NEW - 0 | | 14.7 | 70 | 13541.47 |
| CCA22 - 270 | QUENCH PUMP J - 1802 SEAL FAILURE 1/4" LIQ | 14.7 | 100 | 13919.68 |
| CCA22 - 315 | QUENCH PUMP J - 1802 SEAL FAILURE 1/4" LIQ | 14.7 | 100 | 13919.68 |
| CCA23 - 45 | DEPENTANIZER E - 1801 | 14.7 | 100 | 13919.68 |
| CCA24 - 45 | F - 1805 REFLUX DRUM LEAK 1/4" GAS | 14.7 | 70 | 13541.47 |
| CCA25 - 135 | DEPENTANIZER E - 1801 DRAIN 1" LIQ | 14.7 | 70 | 13541.47 |
| CCA25 - 45 | DEPENTANIZER E - 1801 DRAIN 1" LIQ | 14.7 | 70 | 13541.47 |
| CCA26 - 160 | BENZENE TOWER CONDENSER C-1862 1" LIQ | 14.7 | 70 | 13541.47 |
| CCA26 - 90 | BENZENE TOWER CONDENSER C-1862 1" LIQ | 14.7 | 100 | 13919.68 |
| CCB14 - 180 | GAUGE FAILURE IN FIRST FRACTIONATOR B8.0401 1" LIQ | 14.7 | 70 | 13541.47 |
| CCB14 - 210 | GAUGE FAILURE ON FIRST FRACTIONATOR B8.0401 1" LIQ | 14.7 | 70 | 13541.47 |
| CCB15 - 180 | FIRST STRIPPER D8.0201 1/4" LIQ | 14.7 | 70 | 13541.47 |
| CCB15 - 90 | FIRST STRIPPER D8.0201 1/4" LIQ LEAK | 14.7 | 70 | 13541.47 |
| CCB16 - 180 | DRAIN FROM 1ST EXTRACTOR BOTTOM D8.0102 1" LIQ | 14.7 | 70 | 13541.47 |
| CCB16 - 90 | DRAIN FROM 1ST EXTRACTOR BOTTOM D8.0102 1" LIQ | 14.7 | 70 | 13541.47 |
| CCB17 - 0 | SEAL LEAK IN 2ND EXTRACTOR REFLUX PUMP D3.0301 1/4' LIQ | 14.7 | 100 | 13919.68 |
| CCB17 -1 80 | SEAL LEAK IN 2ND EXTRACTOR REFLUX PUMP D3.0301 1/4' LIQ | 14.7 | 100 | 13919.68 |
| CCB17 - 330 | SEAL LEAK IN 2ND EXTRACTOR REFLUX PUMP D3.0301 1/4' LIQ | 14.7 | 100 | 13919.68 |
| CCB18 | BBC FEED VENTING FROM D9.0001 | 14.7 | 70 | 13541.47 |
| CCB19 | RAFFINATE RUNDOWN FROM D9.0002 | 14.7 | 70 | 13541.47 |
| CCB20 | BD RUNDOWN FROM D9.0003 GAS VENT AT 89051 LB/HR | 14.7 | 70 | 13541.47 |
| CCB21 - 180 | 1ST EXTRACTOR REBOILER D2.0104 TUBE FAILURE 3/4" LIQ | 14.7 | 100 | 13919.68 |
| CCO1 - 180 | DEPROPANIZER E - 1712 1" LIQ DRAIN | 14.7 | 70 | 13541.47 |
| CCO1 - 90 | DEPROPANIZER E - 1712 LIQ | 14.7 | 70 | 13541.47 |
| CCO10 - 0 | ETHYLENE TOWER E - 1710 CRACKING 3/4" LIQ | 14.7 | 70 | 13541.47 |
| CC010 - 180 | ETHYLENE TOWER E - 1710 CRACKING 3/4" LIQ | 14.7 | 70 | 13541.47 |
| CC010 - 270 | ETHYLENE TOWER E - 1710 CRACKING 3/4" LIQ | 14.7 | 70 | 13541.47 |

PREFERENCES: TNT EQUIVALENT CHARGE, PROPRIETARY, 45 DEGREE RULE, ENGLISH UNITS

FIG. 9

PES DEFINITION - BAKER-STREHLOW METHOD

INPUT DATA
PES NAME: 35
PES DESCRIPTION:
LOCATION OF PES CENTER: FT
X: 1040  Y: 2077  Z: 0

PES PICTURE FILE:
[VIEW PICTURE]

SOURCE ENERGY
PROVIDE SOURCE ENERGY OR DATA FOR ENERGY COMPUTATION:
◉ INPUT SOURCE ENERGY:
   SOURCE ENERGY: 1.7E+10   IN-LBF
○ INPUT DATA:
   DENSITY: 0              LBM/FT^3
   HEAT OF COMBUSTION: 0   IN-LBF/LBM
   VOLUME: 0               FT^3

SELECTED FLAME SPEED: 0.662
FLAME EXPANSION: 2D FLAME EXPANSION ▶
OBSTACLE DENSITY: MEDIUM ▶
FUEL REACTIVITY: MEDIUM ▶

FLAME SPEED SELECTION
◉ AUTOMATIC
○ MANUAL
○ USER DEFINED

CONNECTIVITY GROUP: a

[HELP]   [CANCEL]   [OK]

FIG. 10

PES DEFINITION - TNO MULTI-ENERGY METHOD

INPUT DATA
PES NAME: PIPE RACK

PES DESCRIPTION:

LOCATION OF PES CENTER: FT
X: 250
Y: 375
Z: 20

[VIEW/ADD PICTURES]

SOURCE ENERGY
PROVIDE SOURCE ENERGY OR DATA FOR ENERGY COMPUTATION:
◉ INPUT SOURCE ENERGY:
SOURCE ENERGY: 1.37E10  IN-LBF
○ INPUT DATA:
DENSITY: 0  LBM/FT^3
HEAT OF COMBUSTION: 0  [IN-LBF]/lBM
VOLUME: 0  FT^3

SEVERITY LEVEL SELECTION
◉ AUTOMATIC
○ MANUAL

SELECTED SEVERITY LEVEL: 5
FLAME EXPANSION: 3D FLAME EXPANSION ▸
OBSTACLE DENSITY: MEDIUM ▸
FUEL REACTIVITY: MEDIUM ▸

[HELP]  [CANCEL]  [OK]

FIG. 11

PES DEFINITION - TNT METHOD

INPUT DATA
PES NAME: TRUCK BOMB

PES DESCRIPTION:

LOCATION OF PES CENTER: FT
X: 375
Y: 500
Z: 0

VIEW/ADD PICTURES

SOURCE ENERGY
PROVIDE SOURCE ENERGY OR DATA FOR ENERGY COMPUTATION:
○ INPUT SOURCE ENERGY:
　SOURCE ENERGY: 9.0650E+10　IN-LBF
● INPUT DATA:
　EQUIVALENT TNT WEIGHT: 5000　LBS

HELP　　CANCEL　　OK

PES DEFINITION - BURSTING PRESSURE VESSEL METHOD

INPUT DATA
- PES NAME: PROPANE BULLET
- PES DESCRIPTION:
- [VIEW/ADD PICTURES]

LOCATION OF PES CENTER: FT
- X: 575
- Y: 2000
- Z: 5

SOURCE ENERGY
- SOURCE ENERGY: 4.9742E+06 IN-LBF

PRESSURE VESSEL CONTENTS
- PRESSURE: 500 PSI
- TEMPERATURE: 70 DEG. F
- GAMMA: 1.4
- MOLECULAR WEIGHT: 44 GRAMS/MOLE

PRESSURE VESSEL DATA
○ SPHERICAL  ⊙ CYLINDRICAL  ○ OTHER
- DIAMETER: 10 FT
- LENGTH: 20 FT
- HEAD SHAPE: HEMISPHERICAL
- VOLUME: 2094.39500 FT^3

- FRAGMENT REDUCTION FACTOR: .05 %
- LIQUID VOLUME FRACTION: 0 %

[HELP]  [CANCEL]  [OK]

BUILDING/SECTION DEFINITION

BUILDING NAME: WAREHOUSE, 2405
BUILDING DESCRIPTION: LARGE PRE-ENGINEERED WAREHOUSE
SECTION NAME: EAST SECTION
SECTION DESCRIPTION:
CONSTRUCTION TYPE: 7. PRE-ENGINEERED BUILDING (METAL FRAME, METAL CLAD)

LENGTH, L: 70 FT  X POSITION: 280 FT
WIDTH, W: 80 FT  Y POSITION: 1274 FT
HEIGHT, H: 25 FT

MULTI-SECTION BUILDING? ⊙ YES ○ NO
SIDE 1 ORIENTATION (DEG): 0

BUILDING PICTURES

COMPONENTS:

| NAME | DESCRIPTION | SURFACE | COMPONENT TYPE | MATERIAL |
|---|---|---|---|---|
| FRAME | | 1 | 4 | 2 |
| GIRT | | 1 | 7 | 16 |
| WALL PANEL | | 1 | 1 | 2 |
| FRAME | | 3 | 4 | 2 |
| GIRT | | 3 | 7 | 16 |
| WALL PANEL | | 3 | 1 | 2 |
| DECK | | 5 | 6 | 2 |
| PURLIN | | 5 | 8 | 16 |

[DUPLICATE COMPONENT] [ADD COMPONENT] [DELETE COMPONENT]

[HELP] [CANCEL] [OK]

FIG. 14

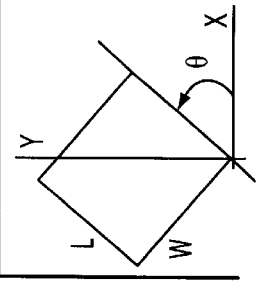

BUILDINGS:

| BUILDING NAME | DESCRIPTION | MULTI-SECTION |
|---|---|---|
| INSULATION SHOP, 2419 | PRE - ENGINEERED BUILDING | NO |
| LABORATORY, 2417 | NON - LOAD BEARING BLOCK W/FINISH | NO |
| MAIN CONTROL ROOM, 1601 | ONLY USED FOR ANALYZING WALLS, ROOF IS DONE BY SDOF | NO |
| MECHANICAL SHOP, 2408 | PRE-ENGINEERED BUILDING | NO |
| OPERATOR COMFORT STATION, 1804 | LOAD - BEARING MASONRY BUILDING | NO |
| POC BUILDING, 2402 | | YES |
| POOL MAINTENANCE, 2600C | MODULAR BUILDING | NO |
| RTFC BUILDING, C0001 | | NO |
| SMI TRAILER, 2600A | TRAILER | NO |
| STARTUP WAREHOUSE, 2410 | WOOD FRAME BUILDING WITH METAL PANEL WALLS AND ROOF | NO |
| WAREHOUSE, 2405 | LARGE PRE - ENGINEERED WAREHOUSE | YES |
| WELDING SHOP, 2406 | PRE - ENGINEERED BUILDING | NO |

SECTION DETAILS:

| SECTION NAME | SECTION DESCRIPTION | LENGTH L(FT) | HEIGHT H(FT) | WIDTH W(FT) | CONSTRUCTION TYPE | X (FT) | Y (FT) | SIDE 1 ORIENTATION (DEG) | NUMBER OF COMPONENTS DEFINED |
|---|---|---|---|---|---|---|---|---|---|
| EAST SECTION | | 70 | 25 | 80 | 7 | 280 | 1274 | 0 | 8 |
| NORTHEAST SECTION | | 112 | 25 | 78.5 | 7 | 483 | 1348 | 0 | 8 |
| NORTHWEST SECTION | | 112 | 25 | 78.5 | 7 | 371 | 1348 | 0 | 8 |
| SOUTHEAST SECTION | | 112 | 25 | 78.5 | 7 | 483 | 1270 | 0 | 8 |
| SOUTHWEST SECTION | | 112 | 25 | 78.5 | 7 | 371 | 1270 | 0 | 5 |
| WEST SECTION | | 70 | 25 | 80 | 7 | 210 | 1274 | 0 | 11 |

PREFERENCES: BAKER-STREHLOW, PROPRIETARY, 45 DEGREE RULE, ENGLISH UNITS

FIG. 16

BUILDING 1 (BDL: , SN: , MAX CDL: , SN: )
    SCENARIO 1 (MAX DL: , SN: , P, I, T)
        SURFACE 1 (MAX DL: , CP; , P, I, T)
            COMPONENT 1 (COMPONENT DL)
            COMPONENT 2 (COMPONENT DL)
            COMPONENT 3 (COMPONENT DL)
        SURFACE 2 (MAX DL: , CP; , P, I, T)
            COMPONENT 1 (COMPONENT DL)
            COMPONENT 2 (COMPONENT DL)
            COMPONENT 3 (COMPONENT DL)
    SCENARIO 2 (MAX DL: , SF: , P, I, T)
        SURFACE 1 (MAX DL: , CP; , P, I, T)
            COMPONENT 1 (COMPONENT DL)
            COMPONENT 2 (COMPONENT DL)
            COMPONENT 3 (COMPONENT DL)
        SURFACE 2 (MAX DL: , CP; , P, I, T)
            COMPONENT 1 (COMPONENT DL)
            COMPONENT 2 (COMPONENT DL)
            COMPONENT 3 (COMPONENT DL)
BUILDING 2 (BDL: , SN: , CDL: , SN: )
    SCENARIO 1 ( DL)
    SCENARIO 2 ( DL)
BUILDING 3 (MAX BDL: , SN: , MAX CDL: , SN: )
    BUILDING 3. SECTION 1 (BDL: , SN: , MAX CDL: , SN: )
        SCENARIO 1 (MAX DL: , SF: , P, I, T)
            SURFACE 1 (MAX DL: , CP; , P, I, T)
                COMPONENT 1 (COMPONENT DL)
                COMPONENT 2 (COMPONENT DL)
            SURFACE 2 (MAX DL: , CP: , P, I, T)
                COMPONENT 1 (COMPONENT DL)
                COMPONENT 2 (COMPONENT DL)
                COMPONENT 3 (COMPONENT DL)
            SURFACE 3 (MAX DL: , CP: , P, I, T)
                COMPONENT 1 (COMPONENT DL)
        SCENARIO 2 (MAX DL: , SF: , P, I, T)
            SURFACE 1 (MAX DL: , CP: , P, I, T)
                COMPONENT 1 (COMPONENT DL)
                COMPONENT 2 (COMPONENT DL)
            SURFACE 2 (MAX DL: , CP: , P, I, T)
                COMPONENT 1 (COMPONENT DL)
                COMPONENT 2 (COMPONENT DL)
                COMPONENT 3 (COMPONENT DL)
            SURFACE 3 (MAX DL: , CP: , P, I, T)
                COMPONENT 1 (COMPONENT DL)

FIG. 19A

```
BUILDING 3. SECTION 2 (BDL: , SN: , MAX CDL: , SN: )
    SCENARIO 1 (MAX DL: , SF: , P, I, T)
        SURFACE 1 (MAX DL: , CP: , P, I, T)
            COMPONENT 1 (COMPONENT DL.)
            COMPONENT 2 (COMPONENT DL)
        SURFACE 2 (MAX DL: , CP: , P, I, T)
            COMPONENT 1 (COMPONENT DL.)
    SCENARIO 2 (MAX DL: , SF: , P, I, T)
        SURFACE 1 (MAX DL: , CP: , P, I, T)
            COMPONENT 1 (COMPONENT DL)
            COMPONENT 2 (COMPONENT DL)
        SURFACE 2 (MAX DL: , CP: , P, I, T)
            COMPONENT 1 (COMPONENT DL)
```

FIGURE 1: RESULTS TREE SCHEMATIC (BDL = BUILDING DAMAGE LEVEL, SN = SCENARIO NUMBER, CDL = COMPONENT DAMAGE LEVEL, DL = DAMAGE LEVEL, P = PRESSURE, I = IMPULSE, T = DURATION)

FIG. 19B

EXPLOSION CONSEQUENCES AND SITING ANALYSIS TOOL

This application includes microfiche appendices. This application is based on Provisional Application No. 60/034,157, having a filing date of Dec. 30, 1996.

BACKGROUND OF THE INVENTION

The present invention relates to a computer system which performs explosion consequences and siting studies for various facilities, such as chemical processing plants, petroleum refineries, and other various types of factories and facilitates. The computer system utilizes software for modeling and simulating both explosion blasts and structural damages. One of the advantages of the present invention is that it automates analysis methods that, while well developed, normally include many tedious and time consuming calculations.

In the past, iteration on explosion hazard parameters such as explosion energy, flame speed, or location of the explosion center was not readily accomplished since significant recalculation was required if any of these parameters were changed. The present invention provides the capability of numerous reiterations on analyses by permitting an unlimited number of variable inputs, as well as an unlimited number of changes which can be recalculated to determine the consequences to sites and buildings based on the user-selected explosion scenarios.

The conventional methods of forecasting explosion consequences and structural damages are time consuming and labor intensive compared with the present invention. Moreover, the conventional methods are restricted to analyzing pre-defined conventional buildings, of which analyses are limited to only one building or site for case-by-case analyses.

Therefore, the present invention provides the advantage of a computer system defining a totally comprehensive site including all of the individual sites and numerous buildings. As such, the computer system serves as a valuable and useful tool for various users, such as safety personnel who are responsible for managing, analyzing and evaluating on-site risks of explosions.

BRIEF SUMMARY OF THE INVENTION

According to this invention, the user selects any combination of hazards and buildings which are of interest in modeling and simulating. The software of the present invention automatically calculates distance and orientation of various building surfaces from the hazard, and accounts for side-on and reflected loads based on the orientation. The user is the provided with the pressure-impulse diagrams (P-i diagrams) where the software determines the damage expected for each building component. The results are displayed in a table which gives the applied blast load and damage level for each component on each building surface.

As pointed out in greater detail below, the important advantage of the present invention is that the computer system reduces labor required for analyzing a site over that required using pre-existing software which treats explosive donors and building acceptors on a case by case basis.

Another advantage to the present invention is that it includes data input screens which are significant improvements over those in pre-existing software, which results in increased productivity.

Moreover, the present invention software plots blast contours and calculates acceptor building blast loads for any of the explosion donors, in part or in whole, and with a myriad of combinations.

An advantage is also provided by the present invention because during the analyses, the software will automatically iterate between the selected donors and acceptors, thereby quickly and efficiently analyzing all possible combinations.

A further advantage of the present invention is provided as the result of the fact that the blast predictions, building damages, and component damages can be summarized by the software in a "results tree" which allows the user to quickly review the results on-screen.

Finally, the present invention provides the advantage of increasing productivity due to its efficient plotting package, thus relieving the user of the requirement to plot contours by other means.

An object of the present invention is to provide a computer system for modeling and simulating explosions at various sites including building and building components for predicting their resultant explosion blast characteristics and explosion damages. The explosion modeling system comprising of data entry means is adapted to receive: preference data including units of measurements, blast models, building damage models, and shock reflection coefficients; scenario data including scenario title, atmospheric and ambient conditions, and potential explosion sites (PES); and building definition data including building title, construction categories, building dimensions, building coordinates and building orientation, and large building data and component data.

The present invention further comprises: a memory coupled to the data entry means for storing the preference data, scenario data, and building definition data; a processor coupled to the memory for computing from the stored preference data, scenario data, and building definition data a representation of the simulated explosion, whereby the simulated explosion includes simulation of blasts and damages to the building components, buildings and sites; and a monitor coupled to the processor for displaying certain of the simulation representations.

Another object of the present invention is to provide a method for modeling and simulating explosions at various sites including building and building components for predicting their resultant explosion blast characteristics and explosion damages. The explosion modeling system employs a computing system having a data entry means, data processing means, a memory and a monitor. The method comprises the steps of: entering and storing preference data into the computing system, whereby the preference data includes units of measurements, blast models, building damage models, and shock reflection coefficients; entering and storing scenario data into the computing system, whereby the scenario data includes scenario title, atmospheric and ambient conditions, and potential explosion sites (PES); and entering and storing building definition data into the computing system, whereby the building definition data includes building title, construction categories, building dimensions, building coordinates and building orientation, and large building data and component data.

The method further includes: computing from the stored preference data, scenario data, and building definition data a representation of the simulated explosion, whereby the simulated explosion includes simulation of blasts and damages to the building components, buildings and sites; and displaying certain of the simulation representations on the monitor.

The invention itself, together with further objects and attendant advantages, will best be understood by reference

BRIEF DESCRIPTION OF THE DRAWINGS

FIG. 8 represents a menu screen available to the users.

FIG. 9 represents a summary data screen available to the users.

FIG. 10 represents a menu screen available to the users.

FIG. 11 represents a menu screen available to the users.

FIG. 12 represents a menu screen available to the users.

FIG. 13 represents a menu screen available to the users.

FIG. 14 represents a menu screen available to the users.

FIG. 16 represents a summary data screen available to the users.

FIGS. 19A and 19B are schematic diagrams illustrating the results output.

DETAILED DESCRIPTION OF A PREFERRED EMBODIMENT

The present invention provides a computer system intended to evaluate sites where explosion hazards are present, for example, at chemical processing plants, petroleum refineries, manufacturing facilities, abandoned ammunition sites, and explosive storage sites. A site is defined by a global X-Y coordinate grid used to locate all donors (potential explosion sites) and all acceptors (occupied buildings). The computer system includes a library of pre-defined conventional buildings which can be selected when creating a file for a given site. In addition, the user can create additional/new buildings or structures which are defined by the components present in those buildings or structures. This feature, the ability to define an entire site including all donor and acceptor locations is a significant improvement over pre-existing software which is formatted to address one donor and one acceptor at a time. This format of defining an entire site is an important aspect of the present invention for its software is specifically intended to serve as a tool for facility safety personnel or related personnel who are responsible for managing, analyzing, and evaluating on-site risks.

Figure 7:
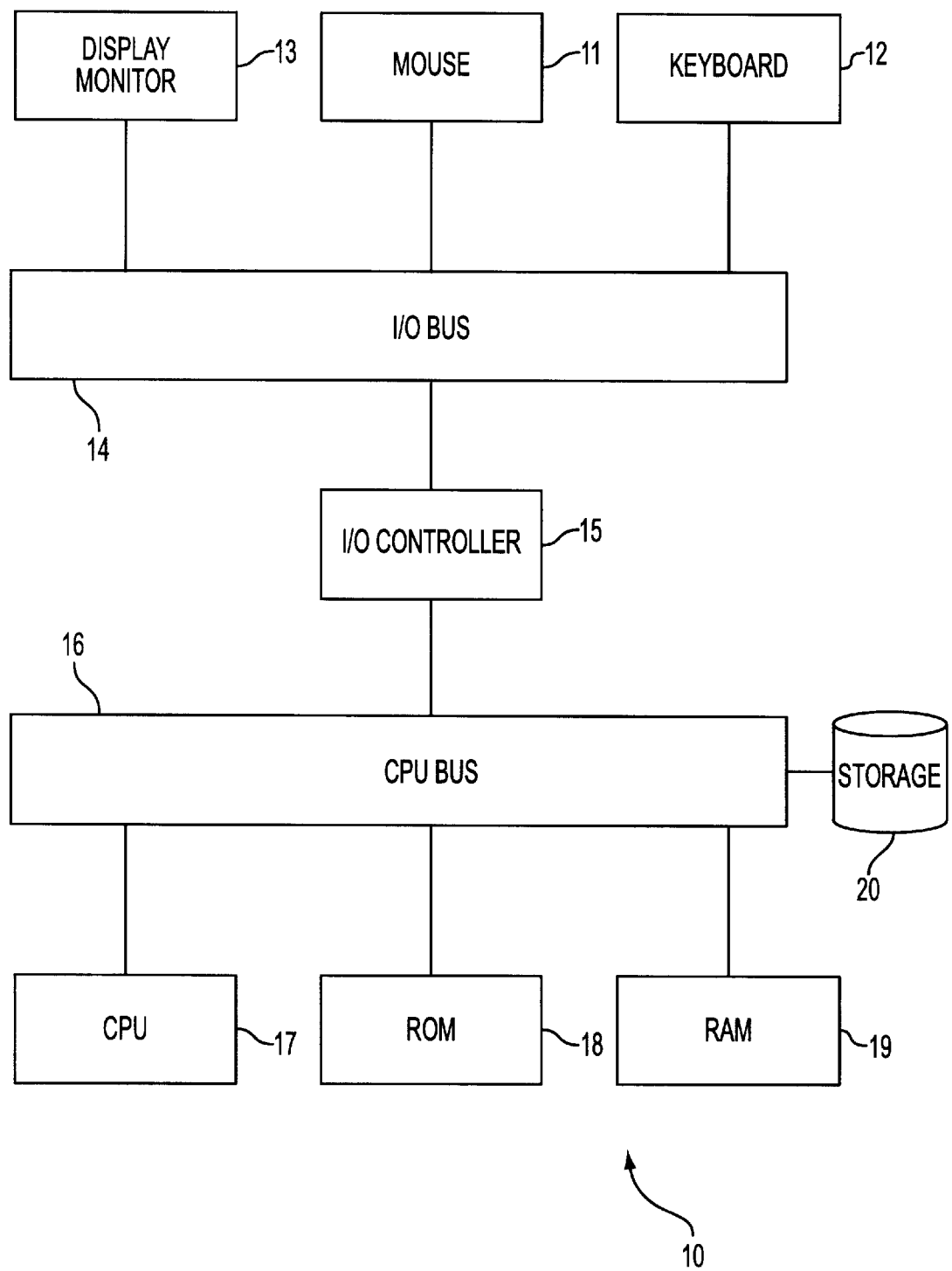
FIG. 7 is a schematic block diagram illustrating components of the invention computer system.

Referring to the drawings, FIG. 7 illustrates one embodiment of the present invention, a computer system for modeling and simulating explosions at various sites and facilities. The computer system 10 is a general purpose computer executing under the graphic system described hereinafter. The preferred embodiment of the present invention a WINDOWS compatible computer. It includes a microprocessor or CPU 17, RAM 19, ROM 18 and storage 20, and interfaces with the user via a mouse 11 and keyboard 12. In one embodiment of the present invention, a modem for communication may be provided and data may be printed on a hard copy printer, which is not shown. Furthermore, in one embodiment of the present invention, the software of the computer system requires a 80486 or PENTIUM based computer running MICROSOFT WINDOWS 3.x. A color VGA monitor 13 being set to a 640×480 resolution or higher is required along with a math-coprocessor and 8 megabytes of RAM. The program requires approximately 6 megabytes of hard disk space.

Figure 1:
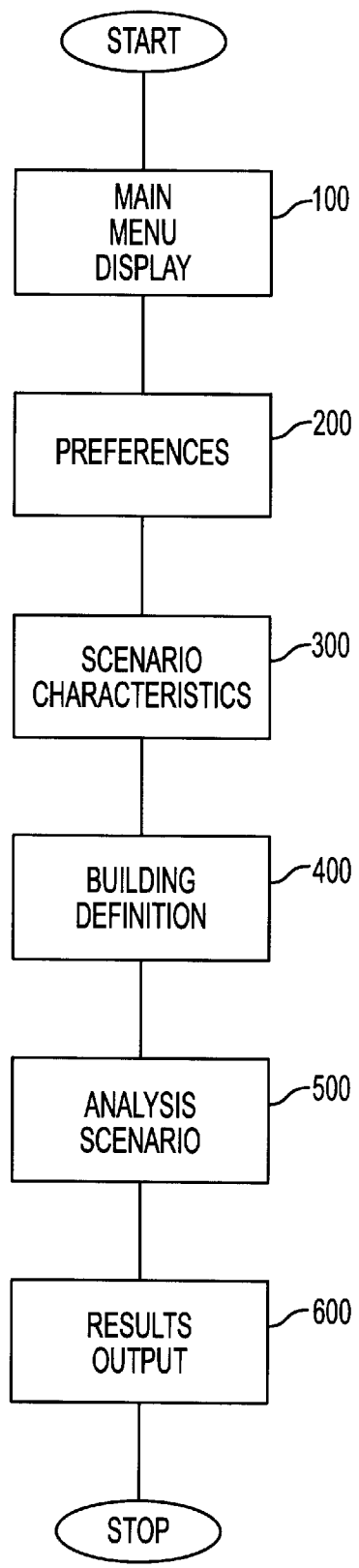
FIG. 1 is a decomposition diagram showing processes included in the invention.

FIG. 1 illustrates a general overview of the steps undertaken by the user in developing the explosion blast and damage model. First, the user refers to the main menu display 100 and inputs the various data, such as the preferences 200, scenario characteristics 300 and building definitions 400, discussed herein after. Next, the user reviews, edits and sets the analysis scenario 500. Thereafter, the computer system analyzes the data and performs the calculations for outputting the results 600.

The software of the computer system includes features which are summarized according to the screens and/or modules, as discussed below. A module is a screen or group of screens which performs an activity.

Figure 2:
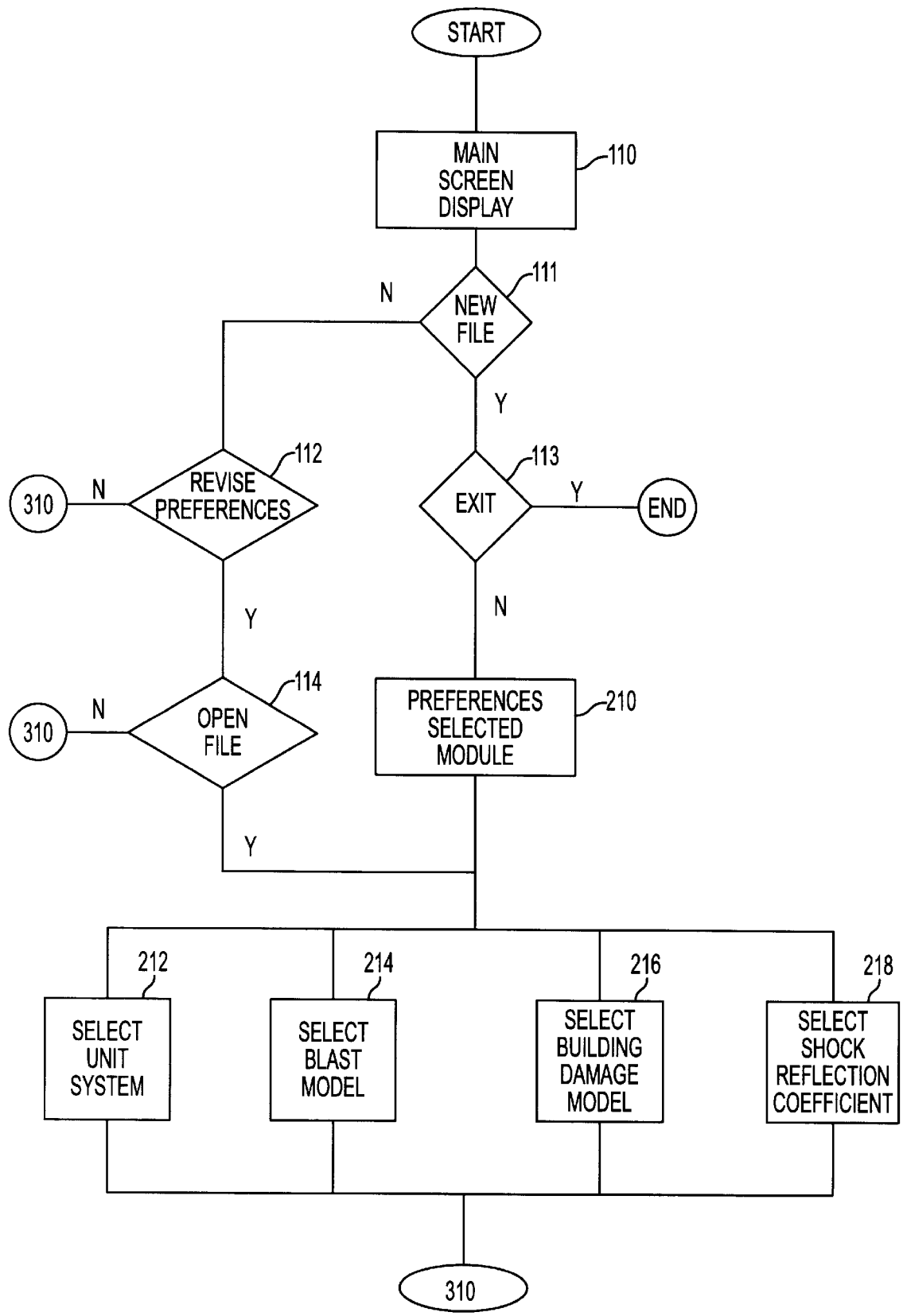
FIG. 2 is a flowchart outlining the steps of the invention pertaining to the main screen display and preferences selected module.
Figure 3:
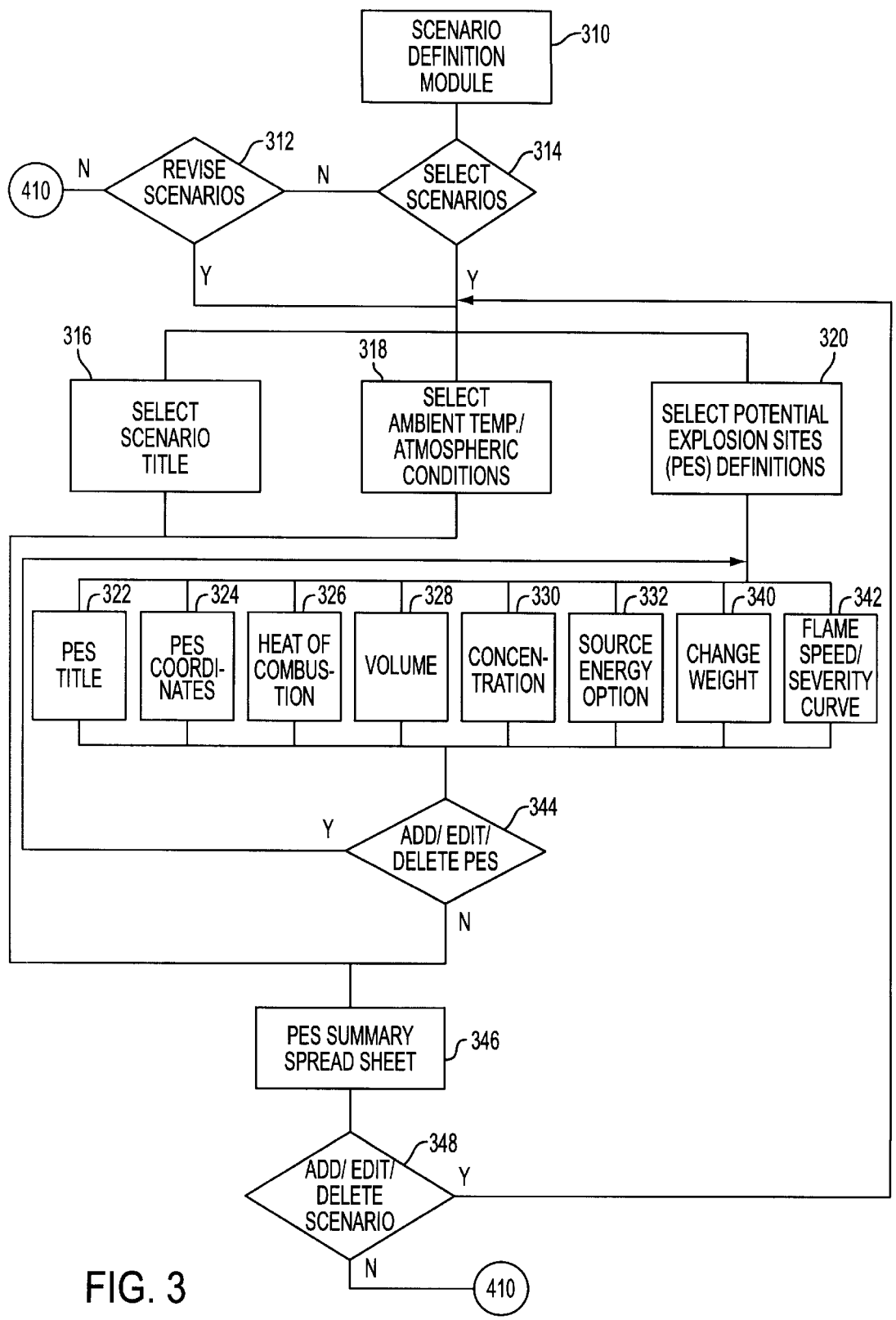
FIG. 3 is a flowchart outlining the steps of the invention pertaining to the scenario definition module.
Figure 4:
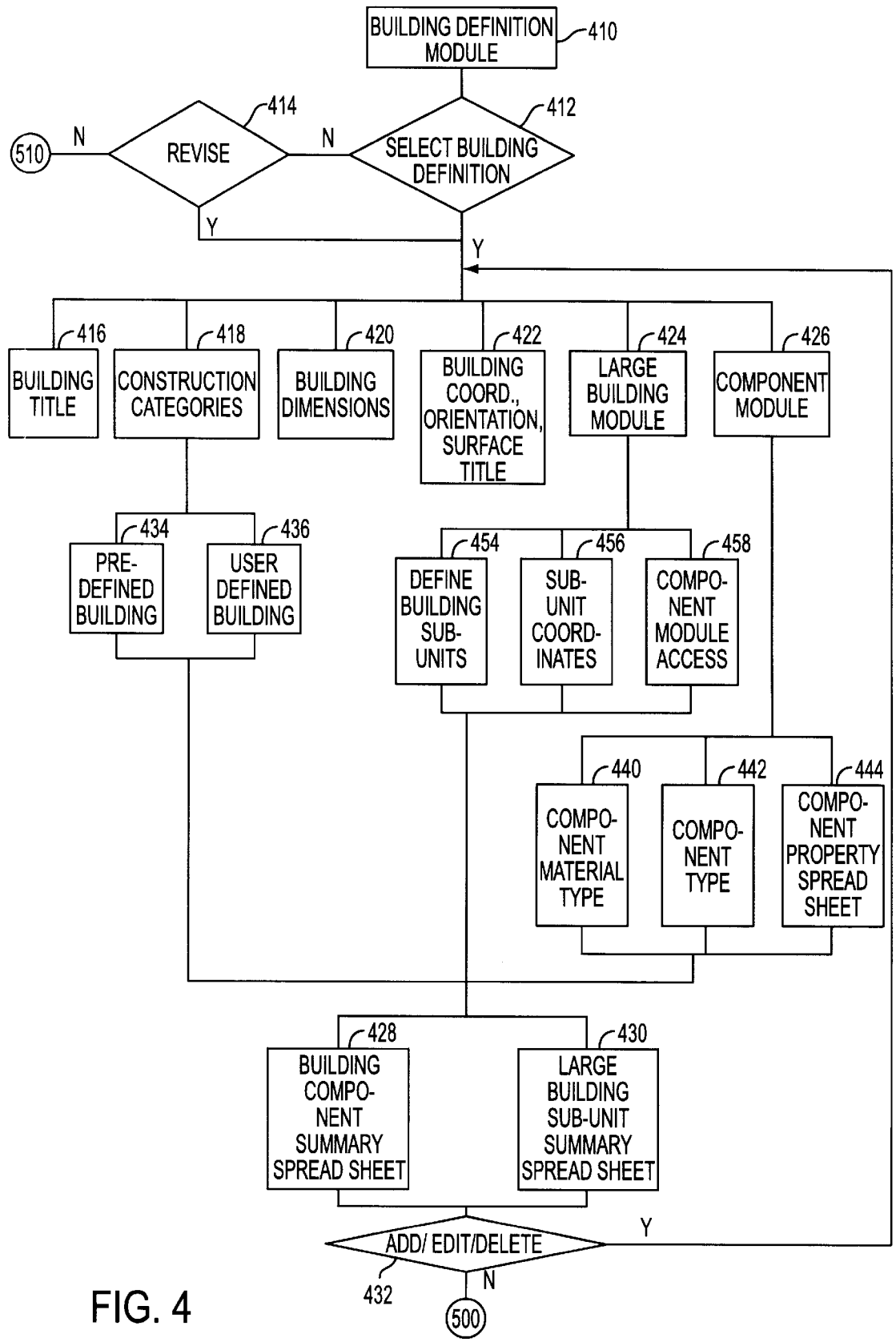
FIG. 4 is a flowchart outlining the steps of the invention pertaining to the building definition module.
Figure 5:
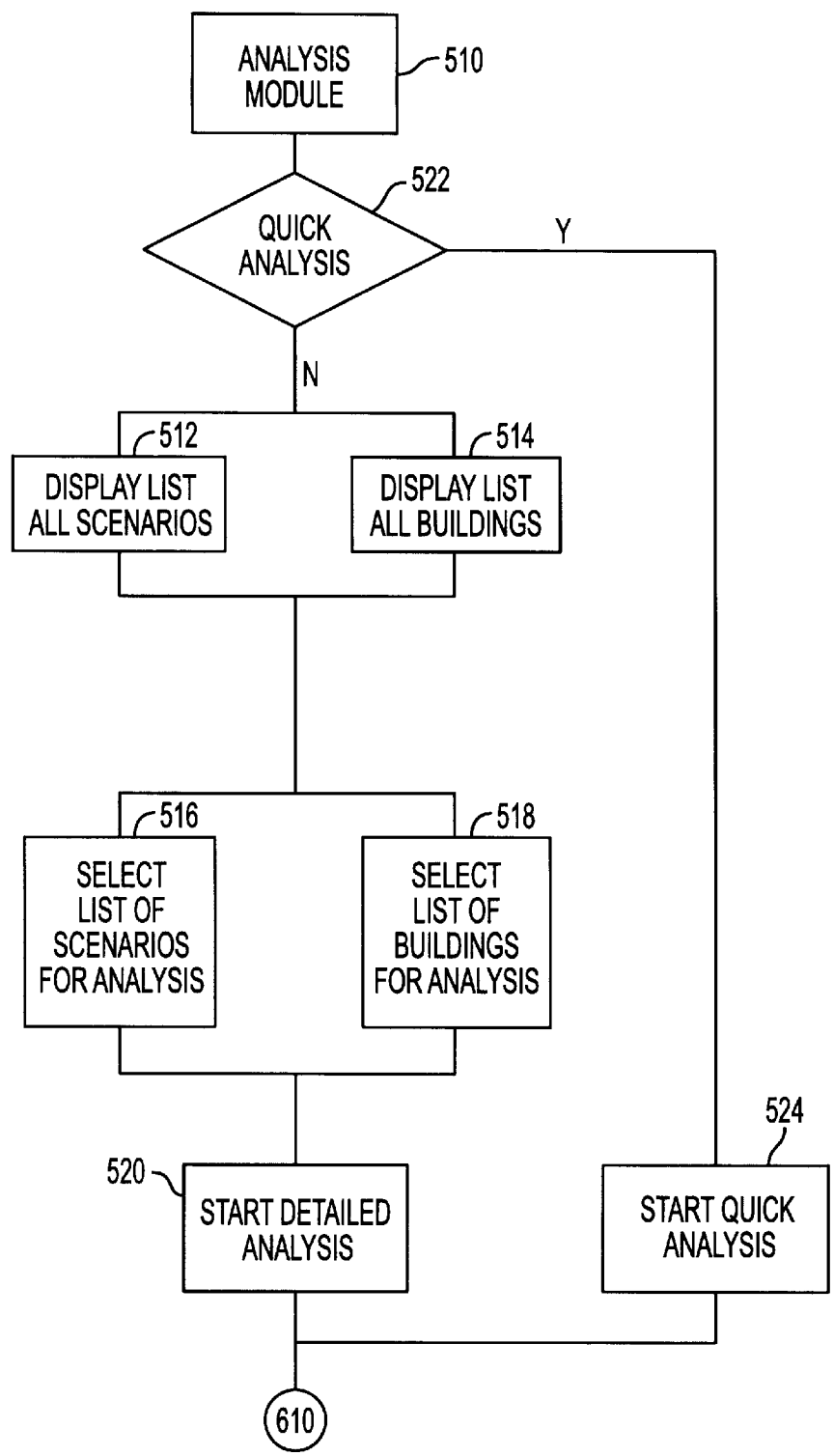
FIG. 5 is a flowchart outlining the steps of the invention pertaining to the analysis module.

Referring now to FIGS. 2 through 6 generally, and to FIG. 2 more particularly, the first screen which appears upon opening the software of the computer system is the main screen display 110 (FIG. 2). The main screen display 110 is the launching point for all other program functions. It allows the user to access the file options, such as preferences selected module 210 (FIG. 2), scenario definition module 310 (FIG. 3), building setup module 410 (FIG. 4), and analysis module 510 (FIG. 5). The file options allow the user to initiate a new file 111, open a file 114 and revise an existing file 112. The main screen display 110 also provides a summary of scenarios and definitions, as discussed in greater detail below.

Preferences selected module 210 is a feature wherein the user selects some of the initial parameters to be utilized in the computer system analysis. First, the user selects the unit system 212 to be utilized, i.e. either Metric or English units. Next the user selects from one of four types of blast models 214 (TNT High Explosive method: TM5-1300; Baker-Strehlow method-vapor cloud explosions; TNO Multi-energy method and Bursting Pressure Vessel method), listed hereafter. Repetitive references are hereby incorporated by references. The first of the four types of blast models 214 is the TNT High Explosive detonation model, TM 5-1300 model. The TM 5-1300 model is disclosed in the U.S. Department of the Army Technical Manual "Structures to Resist the Effects of Accidental Explosions".

The second type of blast model 214 is the Baker-Strehlow method, as disclosed in the reference of Baker, Q. A., Tang, M. J., Scheier, E. A., and Silva, G. J., "Vapor Cloud Explosion Analysis," 28th Annual AIChE Loss Prevention Symposium, Atlanta, Ga., Apr. 19, 1994.

In addition, the third type of blast model 214 is the TNO Multi-energy method, as disclosed in the reference of B. J. Wiekema, "Vapor Cloud Explosion Model," Journal of Hazardous Materials, 3 (1980), 221–232.

Finally, the fourth type of blast model is the bursting pressure vessel method, as disclosed in the reference by Baker et al., "Explosion, Hazards and Evaluations".

Next the user selects from one of two types of building damage models 216 (i.e., either the Coop95 method or FACEDAP method), listed hereafter. Repetitive references are hereby incorporated by reference. These methods are Pressure-Impulse (P-i) diagram based algorithms. The FACEDAP building damage method is disclosed in the "Facility And Component Explosive Damage Assessment Program User's Manual," Protective Design—Mandatory Center of Expertise Technical Report 92 -2, prepared by Southwest Research Institute, Project No. 06-5145-001 for the Department of the Army, Corps of Engineers, Omaha District, CEMRO-ED-ST, Contract No. DACA 45-91-D-0019, April 1993. Next, the coop95 building damage method is disclosed in the Barker, D. D., Lowak, M. J., Oswald, C. J., Peterson, J. P., Stahl, M. W., Waclawczyk, J. H., "Conventional Building Blast Performance Capabilities," Prepared for 1995 Technology Cooperative, WBE Final Report 730-001, December 1996.

Finally, the user selects the shock reflection coefficient 218 applicable to the particular site and building explosion calculation.

Referring to FIG. 3, once the preference selected module 210 screens have been selected by the user, the next step is to input the scenario definition module 310 by selecting a new scenario 314 or revising an existing scenario 312. The scenario definition module 310 allows the user to specify the input needed to define a particular explosion scenario. A scenario is defined by entering a scenario title 316, atmospheric pressure and ambient temperature 318, and numerous potential explosion sites (PES) 320. Some examples of PES parameters are PES tile 322, PES coordinates 324, heat of combustion 326, volume 328, concentration 330, source energy option 332, change weight 340, and flame speed/severity curve 342, including automatic and manual specifications. FIG. 8 illustrates a display screen for entering data in the scenario definition module 310. FIGS. 10–13 display PES definition screens for the following respective blast models, Baker-Strehlow method, TNO multi-energy method, TNT method, and bursting pressure vessel method. Still referring to FIG. 3, next the user has the option of adding to or deleting and editing the PES information 344. Finally, the scenario definition module screen 310 displays a summary 346 of the scenario definition module 310 for the specified scenario so as to provide another opportunity to add, edit or delete 348 the scenario definition information. FIG. 9 illustrates a display screen for the scenario definition summary.

Once the user has finished entering the scenario definition data, then the display monitor 13 prompts the user for the building definition module 410 data. Referring to FIG. 4, this building definition module 410 allows the user to define buildings and building components 412 by specifying a building title 416, construction category 418, building dimensions 420, building coordinates, orientation and surface title 422, large building module 424, and component module 426. FIG. 14 illustrates a display screen for entering building definition data.

Figure 15:
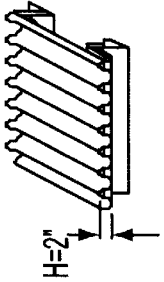
FIG. 15 represents a menu screen available to the users.

The construction category 418 prompts the user to specify data for either predefined buildings 434 (e.g., pre-engineered buildings, unreinforced masonry buildings, load-bearing buildings, trailers and wood frame structures) or user defined buildings 436, which are buildings uniquely specified by the user. FIG. 15 illustrates a display screen for entering data for a predefined building type, i.e., a pre-engineered building in this illustration. The large building module 424 prompts the user to enter the building's sub-unit names 454, sub-unit coordinates 456 and the components module access 458. The component module 426 prompts the user to specify the component material type 440 (e.g., steel, masonry, concrete and wood), component type 442 (e.g., joist, beam and wall) and component property 444 which provides a spreadsheet prompting various properties, for example, spans, spacing section properties, surface definition, etc. . . .

As a result, the present invention provides the user the flexibility of defining pre-defined or user defined buildings which are identified by the entire building or the sub-building sections of a large building. The building definition module 410 screen displays a summary spreadsheet of building components 428 and/or sub-units 430 for the building sites under consideration so as to provide an opportunity to add, edit or delete 432 the building information. FIG. 16 illustrates a display screen for the building summary spreadsheet.

Figure 17:
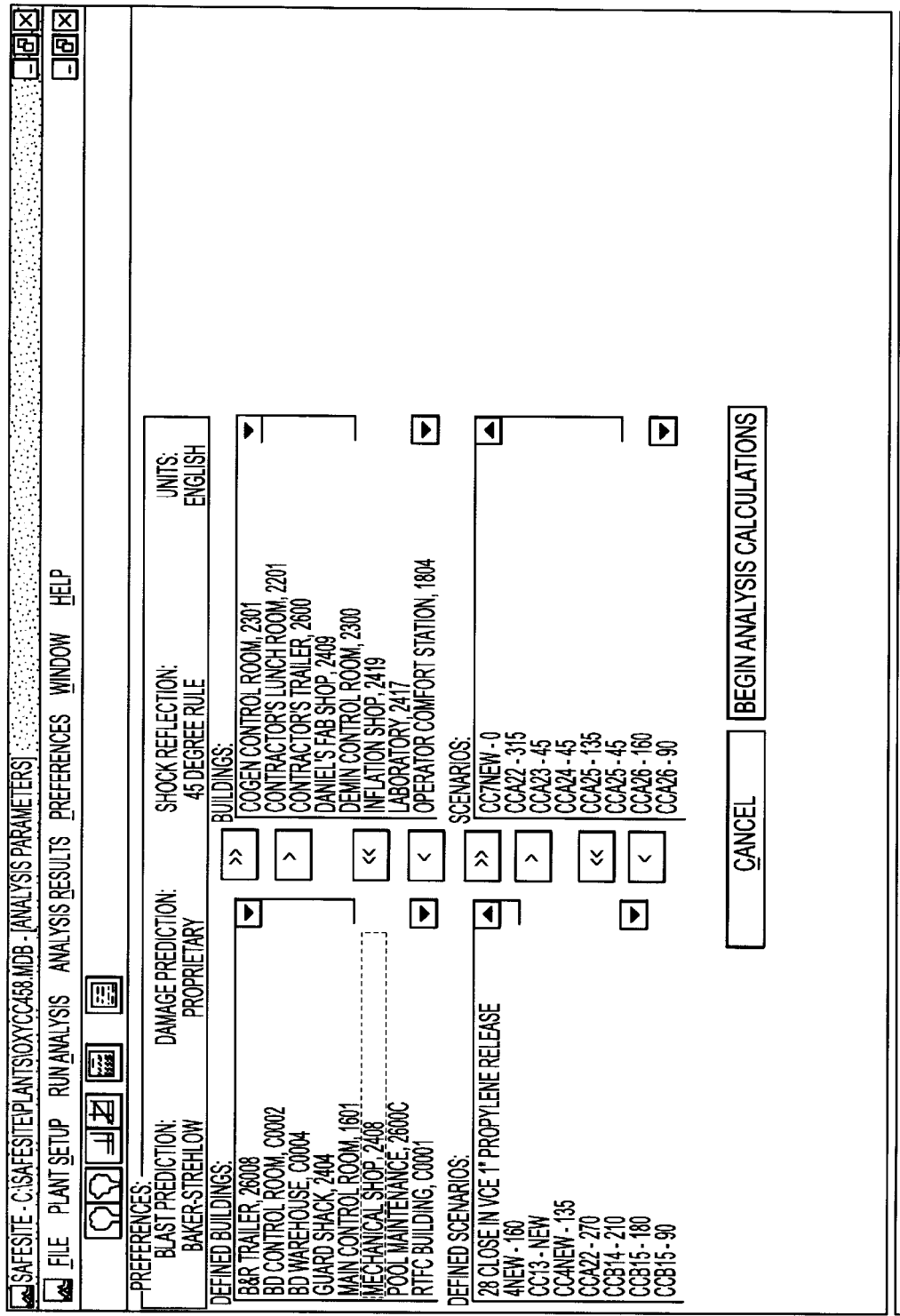
FIG. 17 represents a summary data screen available to the users.

Referring to FIG. 5, finally, the present invention provides the user an analysis module 510 containing a list of all defined scenarios 512 and buildings 514 at a given plant or site. From this list the user may select any of the scenarios 516 or buildings 518 for an analysis, either in part or in their entirety. Once the user has selected which scenarios and buildings they wish to analyze the user starts 520 the program and the detailed analysis is then executed and the program proceeds to the Output Module 610 which will summarize the results 612 under an output module 610. FIG. 17 illustrates the display screen of the analysis parameters. The above detailed analysis is performed when the specific building components have been defined. Alternatively, the user may designated 522 that a quick analysis 524 be performed in those instances when the building has been designated with predefined building parameters.

Figure 6:
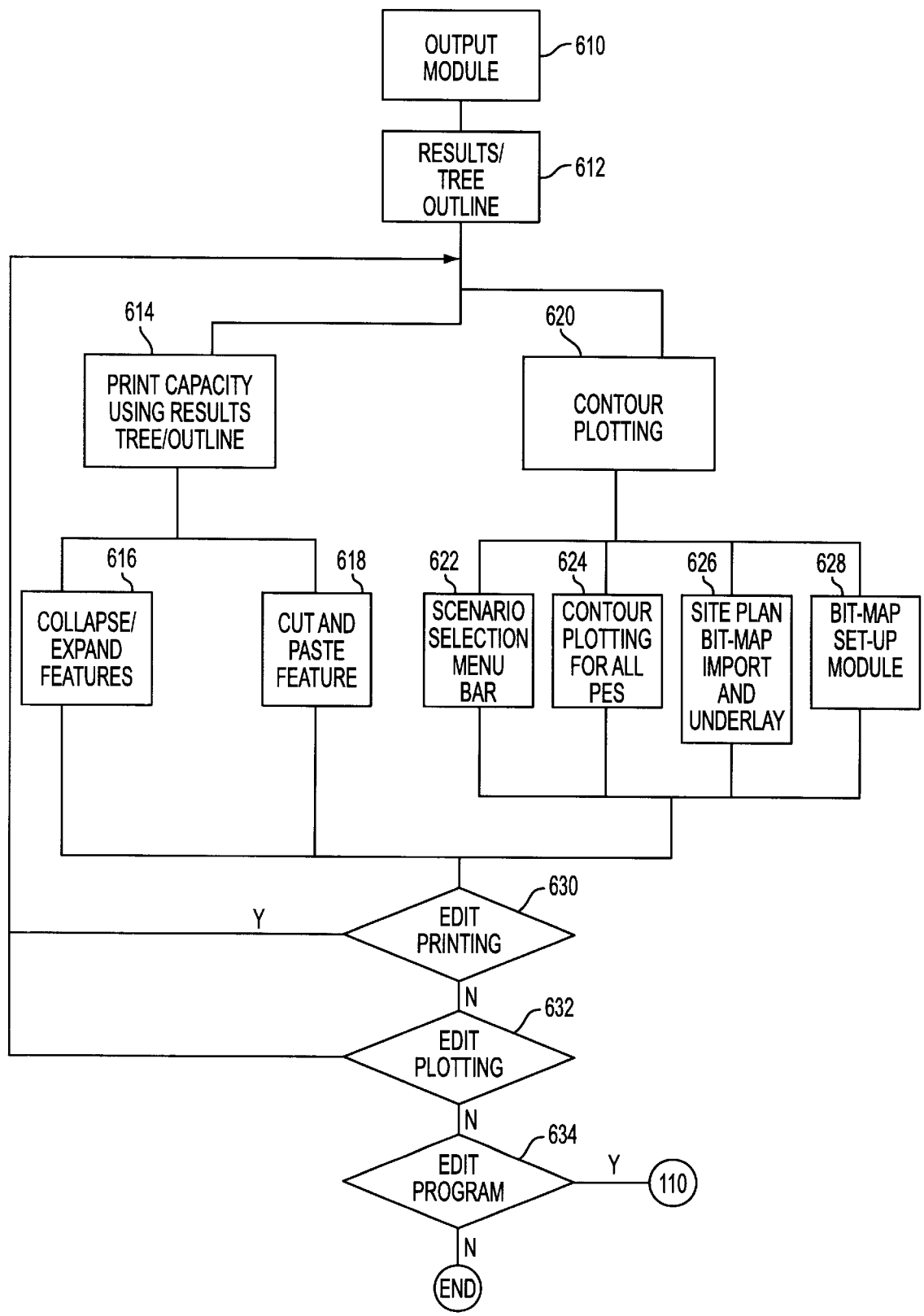
FIG. 6 is a flowchart outlining the steps of the invention pertaining to the output module.
Figure 18:
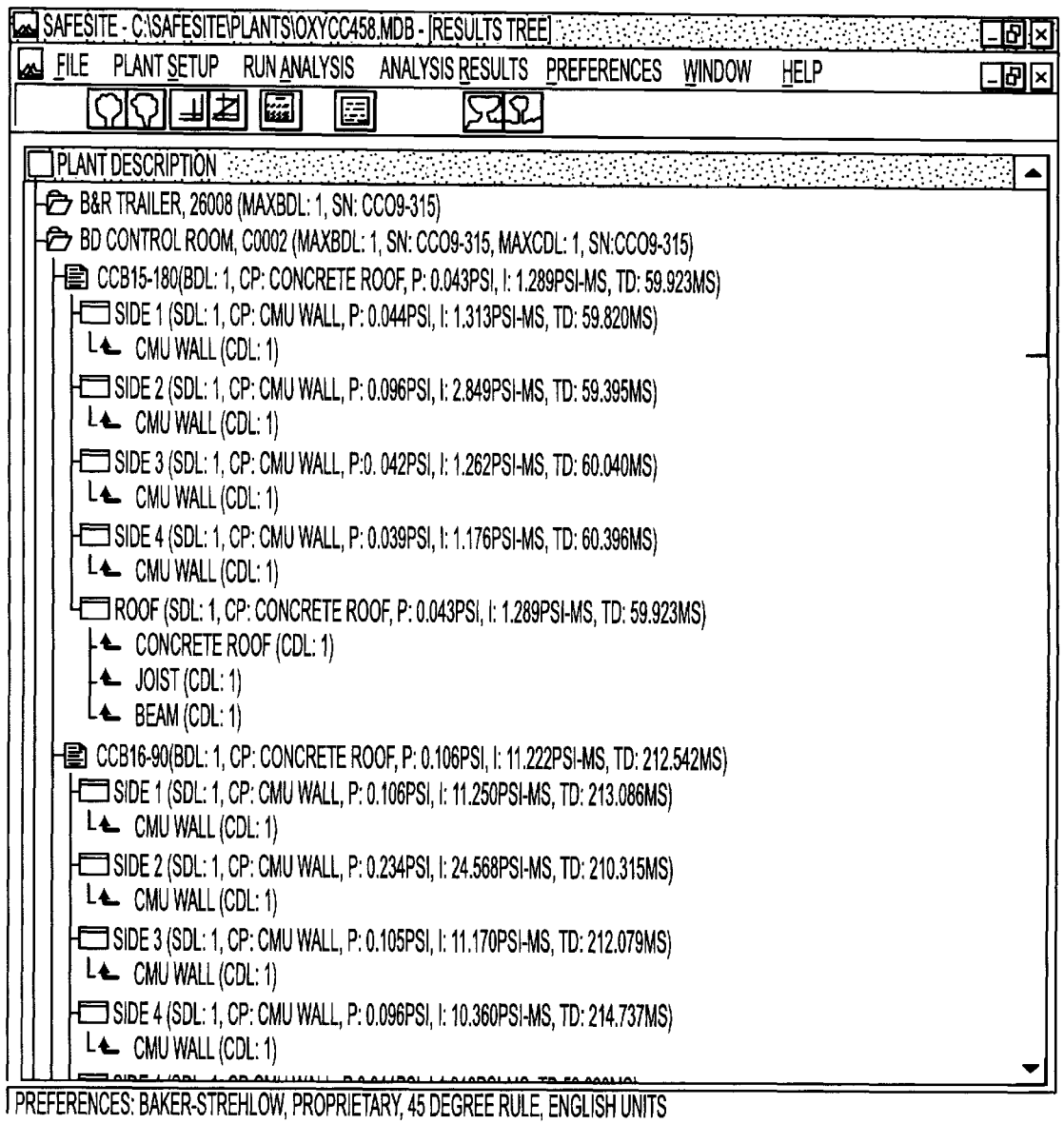
FIG. 18 represents a results data screen available to the users.

Referring to FIG. 6, next, the output module 610 is used to summarize the analysis calculated on the input entered in the scenario definition module and building definition module 410, as selected in the analysis module 510 for calculation. The Output Module 610 displays the results in a tree format/outline 612 with an hierarchical ordering as illustrated in a display screen in FIG. 18. There are four levels within the summary tree. These levels are building, scenario, surface, and component. At each level of the tree, the computed maximum damage levels are listed alongside the building, surface, component or scenario title. The component name and type is also available in the tree. A schematic of the results tree is also shown in FIG. 19. The user has the capability of printing 614 the results, including utilizing the collapse/expand features 616 and cut and paste features 618.

Figure 20:
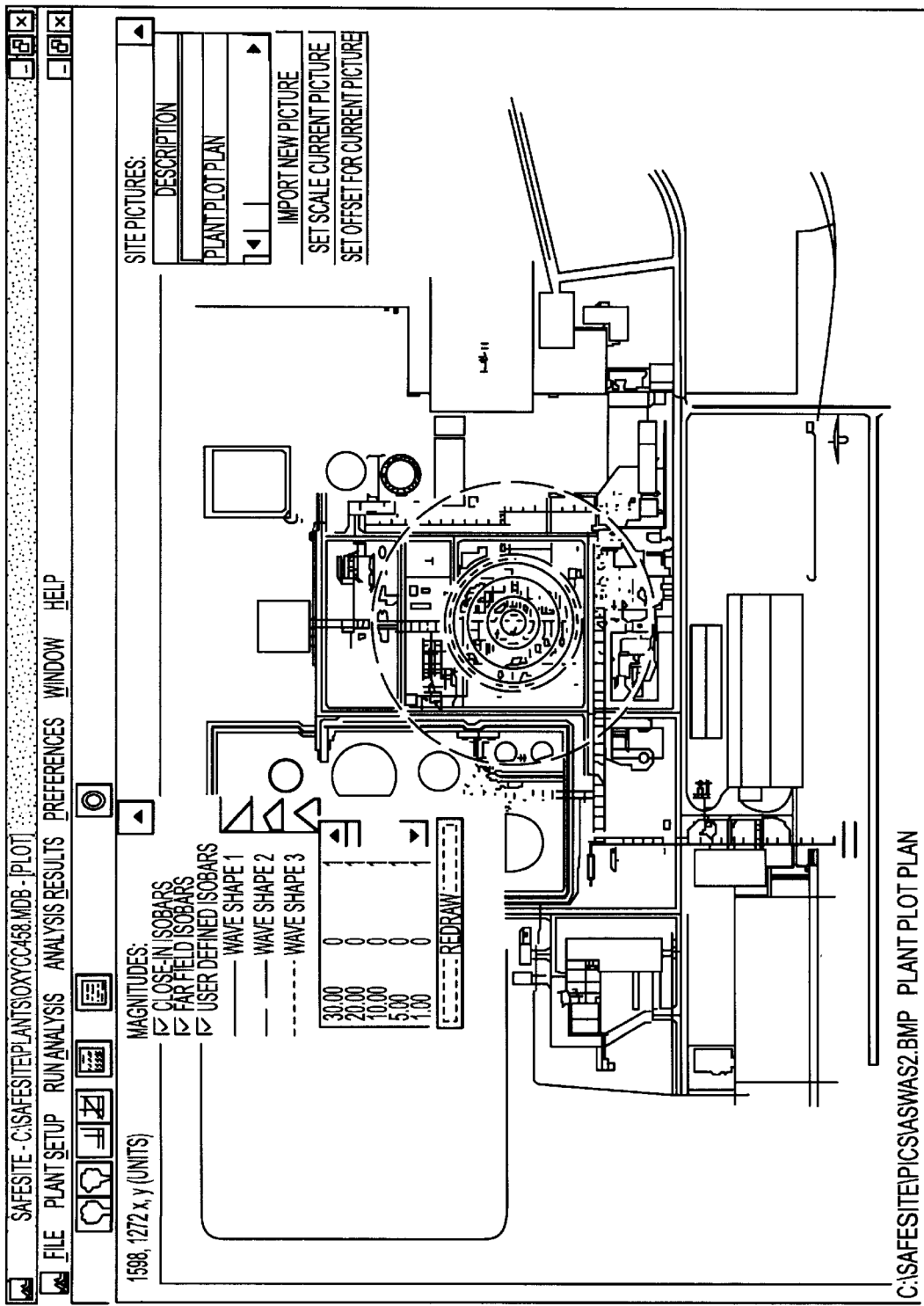
FIG. 20 represents a plan view of a plot contour screen available to the users.

Again, referring to FIG. 6, finally, the output module 610 provides the opportunity to plot the contours 620 at the various plant sites selected. The contour plotting mode includes a scenario selection menu bar 622, contour plotting for all PES of the selected scenarios 624, site plan bit map import and underlay capability 626, and bit map set-up module for defining reference lengths (i.e., scaling) 624. FIG. 20 illustrates a display screen of a plant plot plan.

The attached Appendix A and Appendix B are the graphical interface and Analytical (solution modules and engineering calculations) source codes, respectfully, for operating the present invention computer system.

The present invention described above provides a number of significant advantages. For example, the computer system reduces labor required for analyzing a site over that required using pre-existing software which treats donors and acceptors on a case by case basis. With the present invention, different energies and flame speeds can be quickly evaluated by changing the inputs, thereby allowing quick screening of explosion consequences.

Another advantage to the present invention is that it includes data input screens which are significant improvements over those in pre-existing software, which results in increased productivity. All the screens are new and offer a logical format for data input which facilitates quick data entry for defining donor and acceptors at a given site.

Moreover, the present invention provides the user the ability to select from the given menus any of the various donors and acceptors that are to be analyzed as the user sees fit. The software plots blast contours and calculates acceptor building blast loads for any of the explosion donors, in part or in whole, and with a myriad of combinations.

An advantage is also provided by the present invention because during the analyses, the software will automatically iterate between the selected donors and acceptors, thereby quickly and efficiently analyzing all possible combinations.

A further advantage of the present invention is provided as the result of the fact that the blast predictions, building damages, and component damages can be summarized by the software in a "results tree" which allows the user to quickly review the results on-screen. This advantage, as well as the others discussed above, save the user significant time and increases the user's productivity.

Finally, the present invention provides the advantage of increasing productivity due to its quick plotting package which allows the import of site plan bitmaps for overlay of the calculated blast contours, thus relieving the user of the requirement to plot contours by other means.

Of course, it should be understood, that a wide range of changes and modifications can be made to the preferred embodiments described above. It is therefore intended that the foregoing detailed description be regarded as illustrative rather than limiting and that it is to be understood that it is the following claims, including all equivalents, which are intended to define the scope of the invention.

What is claimed:

1. A computer system for modeling and simulating explosions at various sites including building and building components for predicting their resultant explosion blast characteristics and explosion damages, said explosion modeling system comprising:

data entry means adapted to receive:
        preference data including units of measurements, blast models, building damage models, and shock reflection coefficients;
        scenario data including scenario title, atmospheric and ambient conditions, and potential explosion sites (PES);
        and
        building definition data including building title, construction categories, building dimensions, building coordinates and building orientation, and large building data and component data;
    a memory coupled to said data entry means for storing said preference data, scenario data, and building definition data,
    a processor coupled to said memory for computing from said stored preference data, scenario data, and building definition data a representation of the simulated explosion, said simulated explosion including simulation of blasts and damages to said building components, buildings and sites; and
    a monitor coupled to said processor for displaying said resultant explosion blast characteristics and explosion damages.

2. The system according to claim 1 wherein said data entry means include means displayed on said monitor prompting the entry of said preference data, scenario data, and building definition data.

3. The system according to claim 2, further comprising means for computing changes among the received preference data, scenario data, and building definition data.

4. The system according to claim 3 including means for generating at least one pre-analysis spreadsheet for listing said data describing a pre-analysis scenario for listing said preference data, scenario data, and building definition data summarizing the data to be computed in said processor.

5. The system according to claim 4, further comprising means for generating at least one simulation output spreadsheet for listing said representation of the simulated explosions, said representation including the blast simulation and damage simulation.

6. The system according to claim 5 wherein said means for generating said simulation output spreadsheet further comprises means for organizing the representation of the simulated explosions on a hierarchical basis.

7. The system according to claim 1 wherein said data entry means includes means for generating menus, dialog boxes, and icons to facilitate entering of said data.

8. A method for modeling and simulating explosions at various sites including building and building components for predicting their resultant explosion blast characteristics and explosion damages, said explosion modeling system employing a computing system having a data entry means, data processing means, a memory and a monitor, said method comprising the steps of:

entering and storing preference data into said computing system, said preference data including units of measurements, blast models, building damage models, and shock reflection coefficients;
    entering and storing scenario data into said computing system, said scenario data including scenario title, atmospheric and ambient conditions, and potential explosion sites (PES);
    entering and storing building definition data into said computing system, said building definition data including building title, construction categories, building dimensions, building coordinates and building orientation, and large building data and component data;
    computing from said stored preference data, scenario data and building definition data a representation of the simulated explosion, said simulated explosion including simulation of blasts and damages to said building components, buildings and sites; and
    displaying said resultant explosion blast characteristics and explosion damages on said monitor.

9. The method according to claim 8 including the step of generating displays on said monitor prompting the entry of said preference data, scenario data, and building definition data.

10. The method according to claim 9 including computing changes among the entered said preference data, scenario data, and building definition data.

11. The method according to claim 10 including generating at least one pre-analysis spreadsheet of adjustable format for listing said data describing a pre-analysis scenario for listing said preference data, scenario data, and building definition data summarizing the data to be computed in said data processing means.

12. The method according to claim 11 including generating at least one simulation output spreadsheet of adjustable format for listing said representation of the simulated explosions, said representation including the blast simulation and damage simulation.

13. The method according to claim 12 including generating said simulation output spreadsheet having representation of the simulated explosions on a hierarchical basis.

14. The method according to claim 8 including entering said data with menus, dialog boxes, and icons to facilitate the entering of said data.

\* \* \* \* \*